(12) United States Patent
Wang et al.

(10) Patent No.: US 8,901,948 B2
(45) Date of Patent: Dec. 2, 2014

(54) WAFER PROBE CARD

(75) Inventors: Chia-Huang Wang, Kaohsiung (TW); Hsin Chieh Lu, Kaohsiung (TW); Jung Fu Lee, Kaohsiung (TW)

(73) Assignee: Winway Technology Co., Ltd., Kaohsiung (TW)

( * ) Notice: Subject to any disclaimer, the term of this patent is extended or adjusted under 35 U.S.C. 154(b) by 470 days.

(21) Appl. No.: 13/310,833

(22) Filed: Dec. 5, 2011

(65) Prior Publication Data
US 2013/0141130 A1 Jun. 6, 2013

(51) Int. Cl.
*G01R 1/067* (2006.01)

(52) U.S. Cl.
USPC .............. 324/756.03; 324/754; 324/755.01; 324/756; 324/758; 324/761

(58) Field of Classification Search
CPC .......... G01R 1/07; G01R 31/28; G01R 1/067; H01L 2924/00
USPC ............ 324/754, 755, 756, 762, 149, 755.01, 324/758, 761
See application file for complete search history.

(56) References Cited

U.S. PATENT DOCUMENTS

| 5,355,079 | A | * | 10/1994 | Evans et al. | 324/755.05 |
| 7,514,944 | B2 | * | 4/2009 | Smith et al. | 324/755.09 |
| 2001/0019276 | A1 | * | 9/2001 | Yoshida et al. | 324/754 |
| 2008/0100320 | A1 | * | 5/2008 | Miller et al. | 324/754 |
| 2008/0174326 | A1 | * | 7/2008 | Jeon et al. | 324/754 |

\* cited by examiner

*Primary Examiner* — Arleen M Vazquez
*Assistant Examiner* — Neel Shah
(74) *Attorney, Agent, or Firm* — Alan Kamrath; Kamrath IP Lawfirm, P.A.

(57) ABSTRACT

A wafer probe card has an adapter module and a probe module detachably mounted together. The adapter module has a holding member and an interposer mounted within the holding plate. The probe module has a frame assembly and a space transformer and a probe assembly mounted within the frame assembly. A fixing plate is mounted on the holding member of the adapter module to constitute an electrical connection among the interposer, space transformer and probe assembly. When any element of the wafer probe card is faulty, the adapter module or the probe module is detached and the faulty element is replaced. The adapter module or the probe module with the replaced element is then reassembled. Alternatively, the adapter module or the probe module can be replaced on a modular basis. Accordingly, it is not necessary that all components be detached entirely, thereby improving the operational speed and efficiency.

6 Claims, 9 Drawing Sheets

WAFER PROBE CARD

BACKGROUND OF THE INVENTION

1. Field of the Invention

The present invention relates to an IC testing device and more particularly, to a probe card for wafer level testing.

2. Description of the Related Art

Wafer testers are applied to test wafer yield, employ probes to contact die pads of a tested wafer, and send out testing signals to perform a functional test of the wafer to screen out defective wafers.

With reference to FIG. 10, a conventional probe card of a wafer tester has a wiring board 50, a holding member 51, an interposer 52, a space transformer 53, a probe head 54 and two leaf springs 55. The holding member 51 is mounted on a bottom of the wiring board 50 and has an opening 510 facing downwardly. The interposer 52 is stacked on a top of the space transformer 53, and the interposer 52 and the space transformer 53 are mounted inside the holding member 51. The wiring board 50, the interposer 52 and the space transformer 53 respectively have connection terminals formed thereon coming into electrical connection with one another. The probe head 54 is mounted in the opening 510 of the holding member 51 by abutting against the leaf springs 55. The probe head 54 has a plurality of probes formed thereon to bring into electrical contact with the connection terminals of the space transformer 53. The holding member 51 and the leaf springs 55 are fastened on the wiring board 50 by multiple bolts 56.

When the wafer tester is operated, the probes on the probe head 54 contact a wafer to be tested. The wafer tester transmits test signals to the tested wafer through a microprocessor, and the test signals are transmitted to the tested wafer through the wiring board 50, the interposer 52, the space transformer 53 and the probe head 54. Responding signals generated by the probe head 54 are sent back to the microprocessor for the microprocessor to perform a function analysis. A wafer test can thus be conducted.

When any one of the interposer 52, the space transformer 53 and the probe head is damaged and needs to be replaced, as the holding member 51 and the leaf springs 55 are fastened on the wiring board 50 by the bolts 56, the bolts 56 must be unscrewed first. Then, the holding member 51, the interposer 52, the space transformer 53, the probe head 54 and the leaf springs 55 can be disassembled, and the damaged component can be replaced by a functioning counterpart. However, since the holding member 51, the interposer 52, the space transformer 53, the probe head 54 and the leaf springs 55 are already detached, there is no way to tell which component is damaged. In order to do the troubleshooting, an operation personnel must test all the components one by one, replace the damaged component and reassemble all the components on the wiring board 50. Hence, a single faulty component can cause a lot of inconvenience in maintenance.

Moreover, when the space transformer 53 is mounted on the interposer 52, the connection terminals between the interposer 52 and the space transformer 53 need to be calibrated to ensure that the electrical connections among connection terminals of the interposer 52, the space transformer 53 and the probe head 54 function as intended. Additionally, when the probe head 54 is mounted on the space transformer 53, the electrical connection among the connection terminals of the probe head 54 and the space transformer 53 needs to be calibrated once again. The calibration procedures are complicated and tedious and also cause operational inconvenience.

SUMMARY OF THE INVENTION

An objective of the present invention is to provide a wafer probe card capable of solving the complication and inconvenience associated with disassembling, inspection and assembling of entire elements when any one element of the interposer, space transformer and probe assembly is faulty, and associated with calibration during the assembling process.

To achieve the foregoing objective, the wafer probe card has an adapter module and a probe module.

The adapter module has a holding member and an interposer. The holding member has a first hollow-out area centrally formed through the holding member. The interposer is detachably mounted on the bottom of the holding member and has multiple transfer circuits formed on a portion thereof and aligning with the first hollow-out area of the holding member. Each transfer circuit has multiple contact pads respectively formed on two opposite sides of the interposer. The contact pads on one side of the interposer are electrically and respectively connected with the contact pads on the other side of the interposer.

The probe module has a frame assembly, a space transformer, a probe assembly and a fixing plate. The frame assembly has a second hollow-out area centrally formed through the frame assembly. The space transformer is mounted in the second hollow-out area and has multiple intermediate circuits. Each intermediate circuit has multiple connection terminals formed on a top and a bottom of the space transformer. The connection terminals on the top of the space transformer are respectively and electrically connected with the connection terminals on the bottom of the space transformer. The probe assembly is mounted within the second hollow-out area and has multiple probes respectively and electrically contacting the connection terminals of the intermediate circuits of the space transformer. The fixing plate has a probe opening centrally formed through the fixing plate and aligning with the probes of the probe assembly. The probe module is mounted on the holding member of the adapter module by mounting the fixing plate on the holding member. The frame assembly, the probe assembly and the space transformer are positioned in the first hollow-out area of the holding member. The connection terminals on the bottom of the space transformer electrically and respectively contact the contact pads of the transfer circuits.

As the adapter module and the probe are independently assembled, the interposer, space transformer and probe assembly can be replaced individually or on a modular basis when any one or more thereof are faulty. Accordingly, the operational efficiency of the wafer probe card can be effectively improved in terms of assembling speed and convenience by partially dissembling and modularly replacing the wafer probe card.

Other objectives, advantages and novel features of the invention will become more apparent from the following detailed description when taken in conjunction with the accompanying drawings.

DETAILED DESCRIPTION OF THE INVENTION

Figure 1:
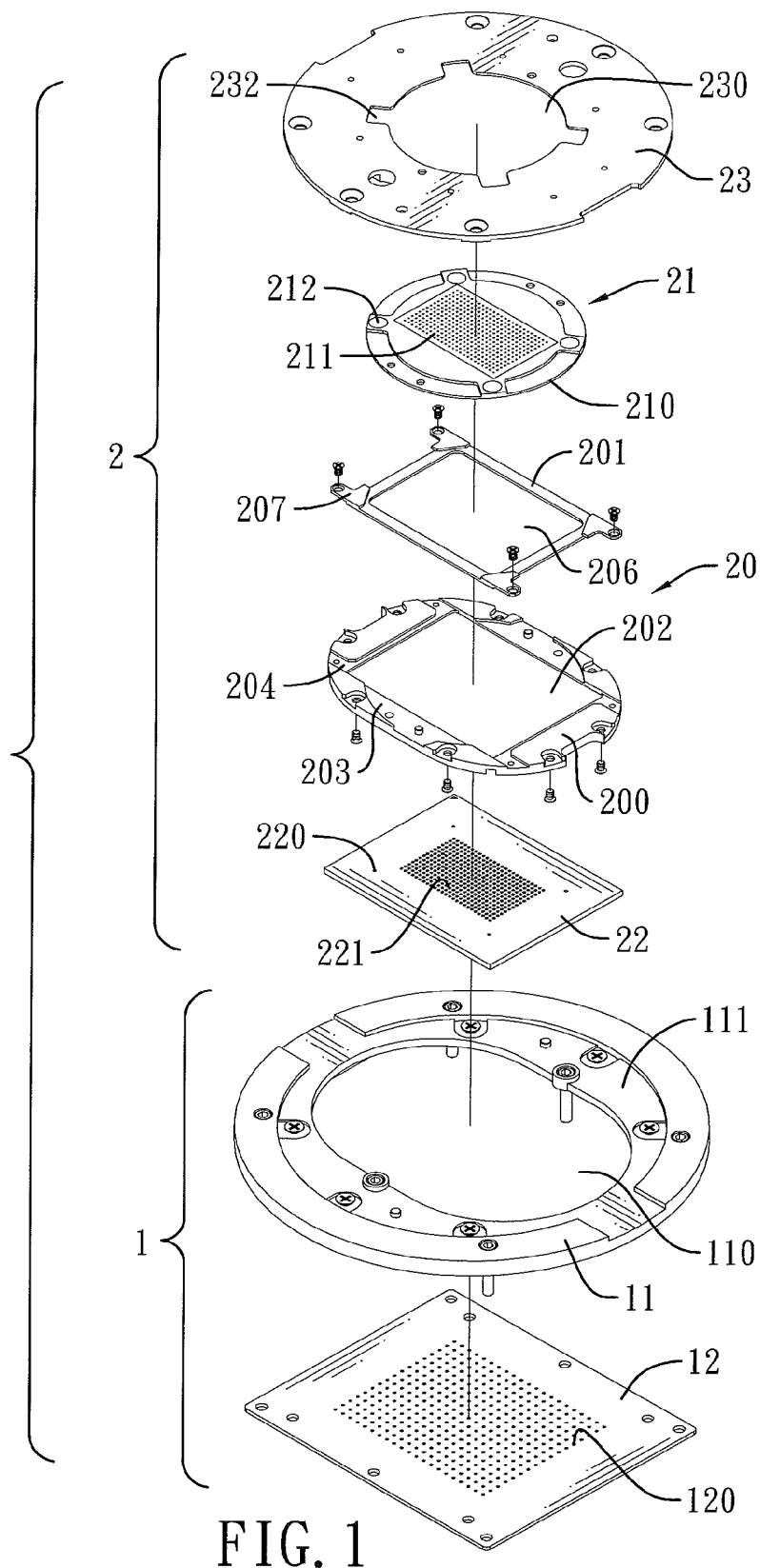
FIG. 1 is an exploded perspective view of a wafer probe card in accordance with the present invention.
Figure 2:
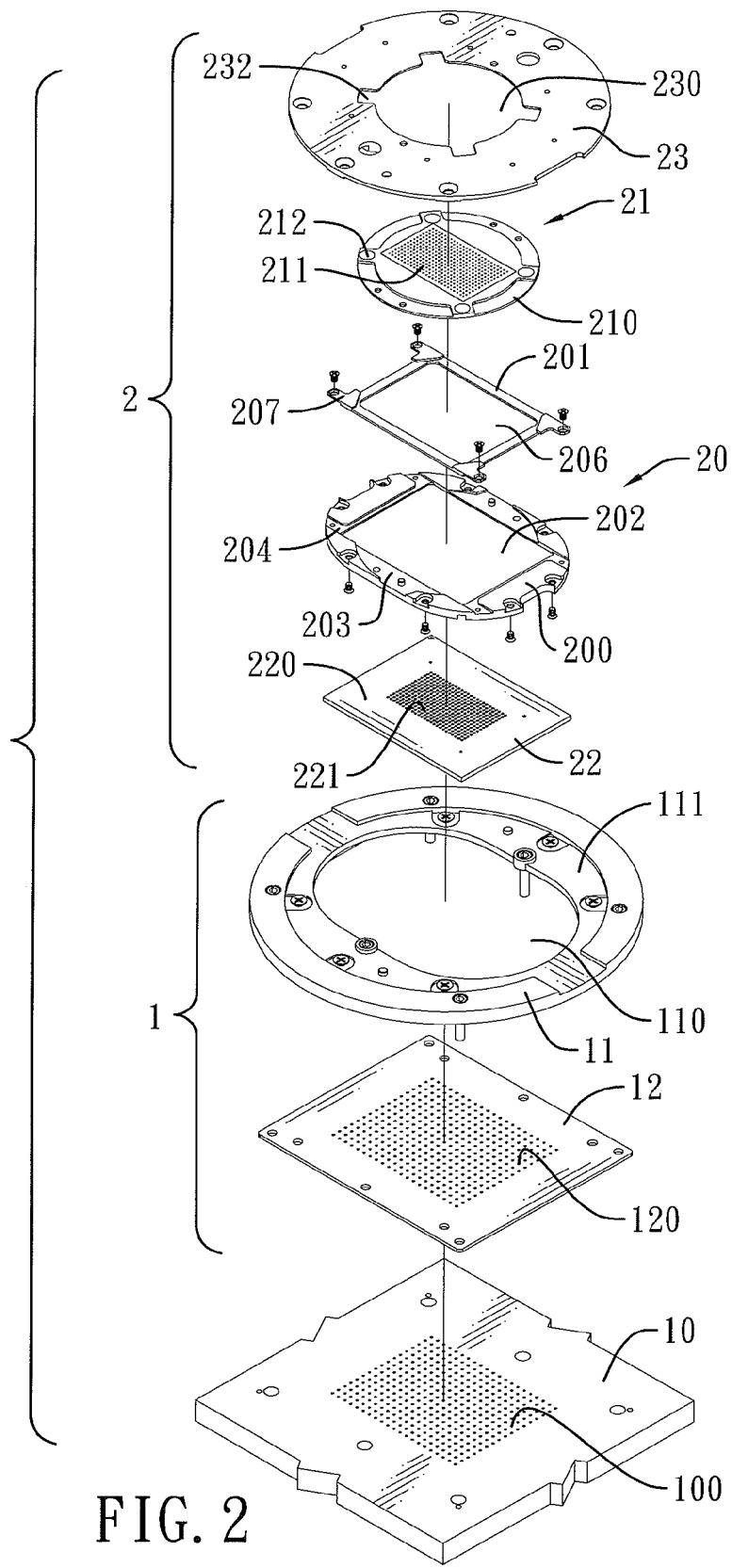
FIG. 2 is another exploded perspective view of the wafer probe card in FIG. 1 and a load board.
Figure 3:
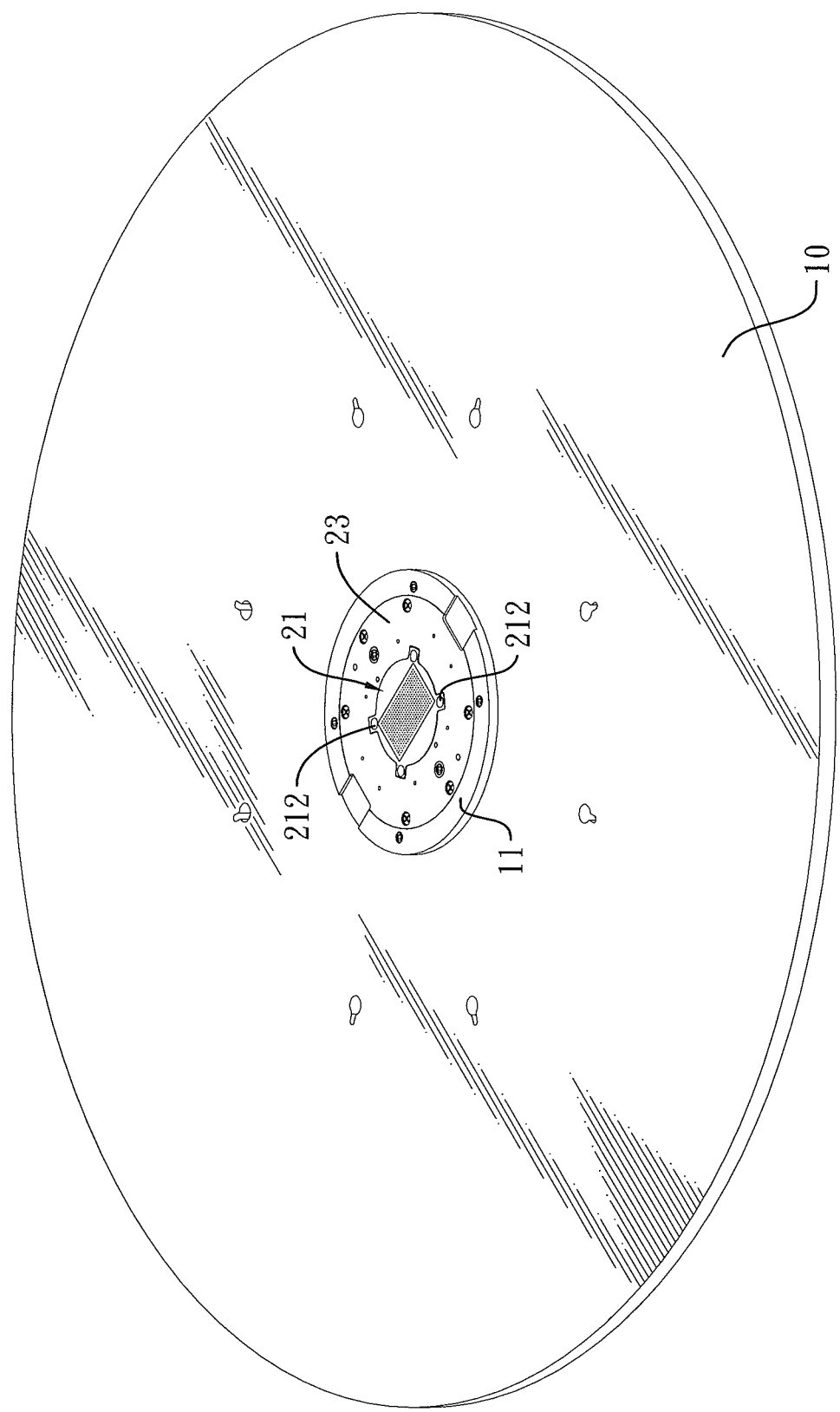
FIG. 3 is a perspective view of the assembled wafer probe card and the load board in FIG. 2.
Figure 4:
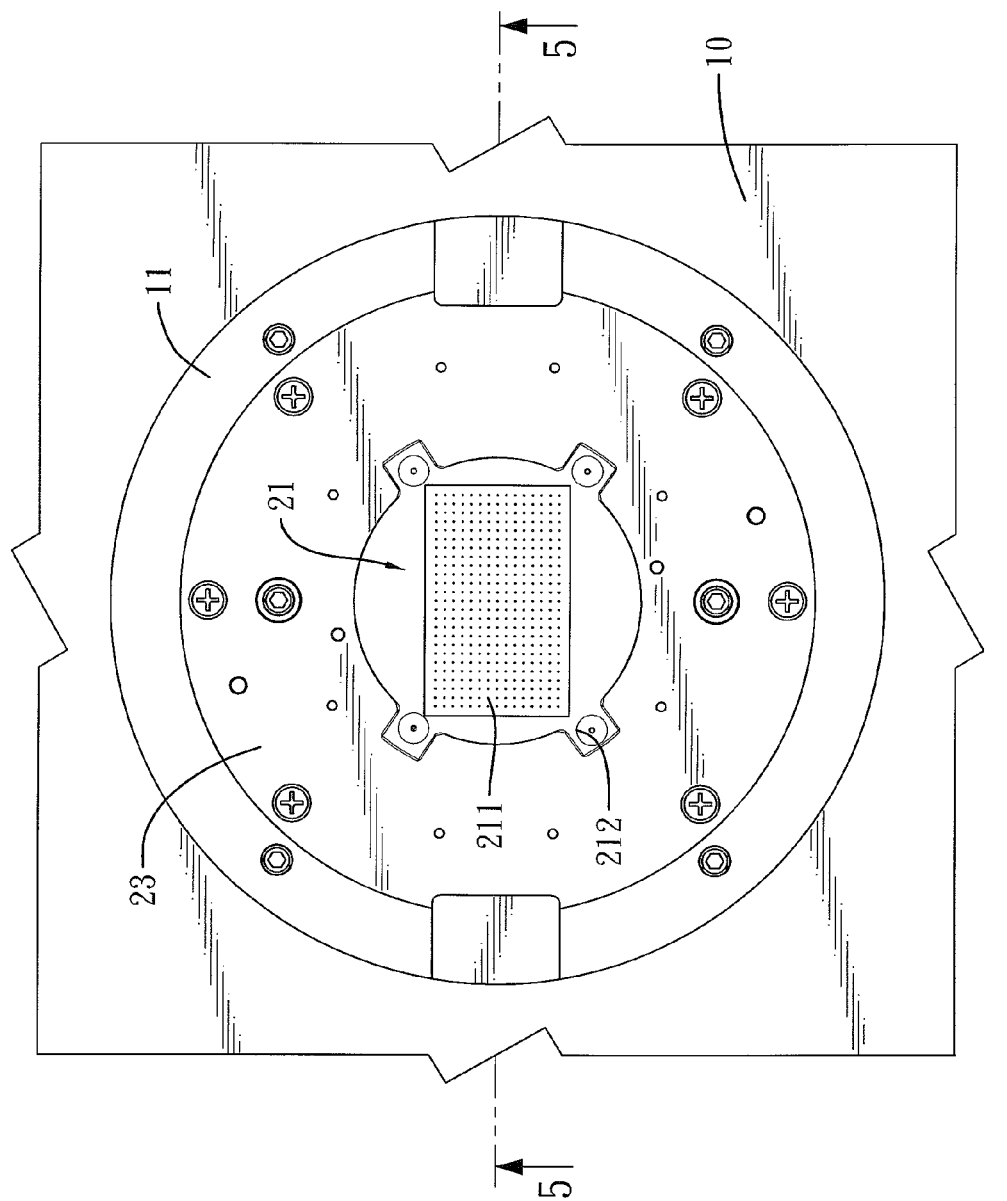
FIG. 4 is an enlarged top view of the assembled wafer probe card and the load board in FIG. 2.

With reference to FIG. 1, a wafer probe card in accordance with the present invention has an adapter module 1 and a probe module 2.

Figure 5:
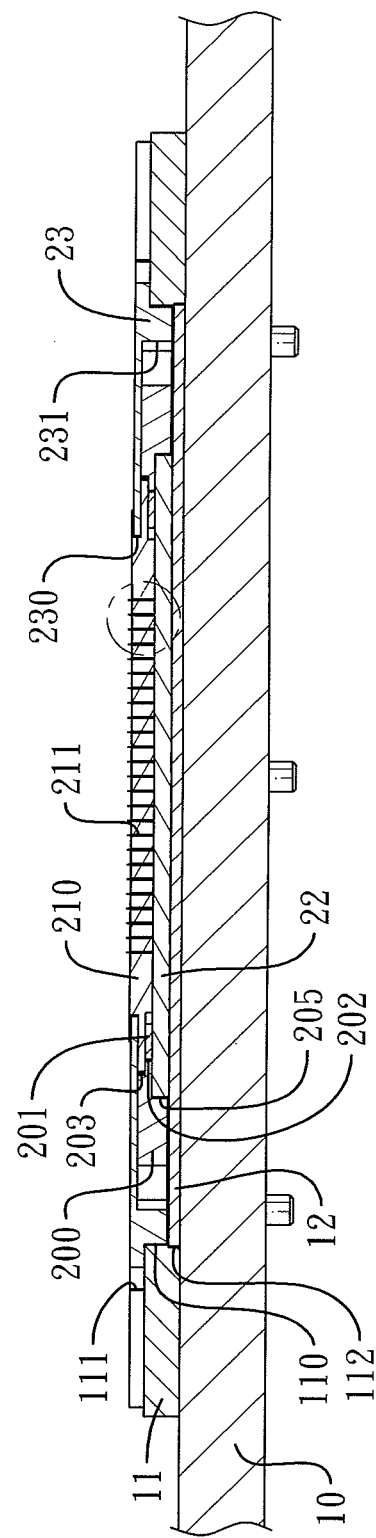
FIG. 5 is a side view in partial section of the wafer probe card and the load board in FIG. 4.

The adapter module 1 has a holding member 11 and an interposer 12. The holding member 11 is annular and has a first hollow-out area 110, a fixing plate recess 111 and an interposer recess 112. The first hollow-out area 110 is centrally formed through the holding member 11. The fixing plate recess 111 is annularly formed in a top of the holding member 11 and around the first hollow-out area 110. The interposer recess 112 is formed in a bottom of the holding member 11 and around the first hollow-out area 110 as shown in FIG. 5.

The interposer 12 is detachably mounted on the bottom of the holding member 11 and aligns with the first hollow-out area 110 of the holding member 11. In the present embodiment, the interposer 12 is mounted in the interposer recess 112 of the holding member 11. The interposer 12 has multiple transfer circuits formed through a portion thereof and aligning with the first hollow-out area 110 of the holding member 11. Each transfer circuit has multiple contact pads 120 respectively formed through two opposite sides of the interposer 12. The contact pads 120 on one side of the interposer 12 are electrically and respectively connected with the contact pads 120 on the other side of the interposer 12.

The probe module 2 has a frame assembly 20, a probe assembly 21, an space transformer 22 and a fixing plate 23.

The frame assembly 20 may be substantially a single element or a combination of multiple elements. In the present embodiment, the frame assembly 20 has a lower frame 200 and an upper frame 201. The lower frame 200 takes a form of an oval ring and has a second hollow-out area 202, two positioning recesses 203, four positioning channels 204 and a transformer recess 205. The second hollow-out area 202 is rectangular and centrally formed through the lower frame 200. Each positioning recess 203 is respectively formed in a top of one of the two long edges of the lower frame 200. Each positioning channel 204 is formed in a top of one of four corners of the lower frame 200. With reference to FIG. 5, the transformer recess 205 is formed in a bottom and around a perimeter of the second hollow-out area 202 of the lower frame 200. The upper frame 201 is rectangular, is mounted on a top of the lower frame 200 and within the second hollow-out area 202 and has a third hollow-out area 206 and four protrusions 207. The third hollow-out area 206 is centrally formed through the upper frame 201. The four protrusions 207 are respectively formed on and horizontally protrude from four corners of the upper frame 201, and are respectively mounted in the four positioning channels 204.

Figure 6:
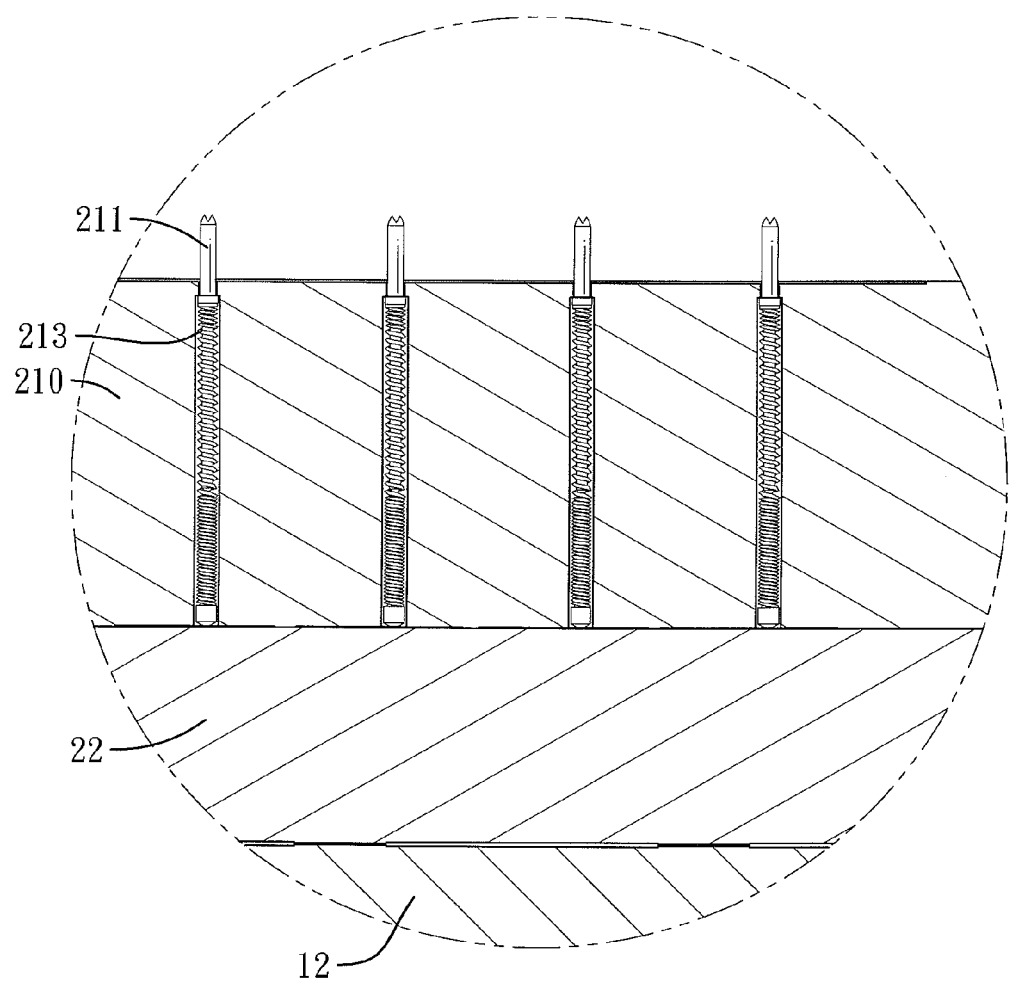
FIG. 6 is a partially enlarged side view of the wafer probe card and the load board in FIG. 5.

The probe assembly 21 is mounted in the frame assembly 20 and has a ceramic board 210 and multiple probes 211. The ceramic board 210 is circular and mounted on a top of the upper frame 201 and in the positioning recesses 203 of the lower frame 200, and has multiple through holes 212. The through holes 212 are vertically formed through a circumferential edge of the ceramic board 210. Two portions of the circumferential edge of the ceramic board 210 corresponding to the positioning recesses 203 of the lower frame 200 are formed to be thinner than the rest portion of the circumferential edge of the ceramic board 210. The probes 211 are formed through and within an area of the ceramic board 210 and surrounded by the through holes 212. Top tips of the probes 211 are formed on and protrude upwardly from a top side of the ceramic board 210. With reference to FIG. 6, each probe 211 has a spring 213 mounted around the probes 211 and abutting against an annular flange formed around a periphery of the probe 211. Each probe 211 together with the spring 213 around the probe 211 are jointly mounted in a probe hole. The probes 211 are resiliently moved up and down relative to the ceramic board 210 and are electrically conducting by the use of the spring 213.

Figure 7:
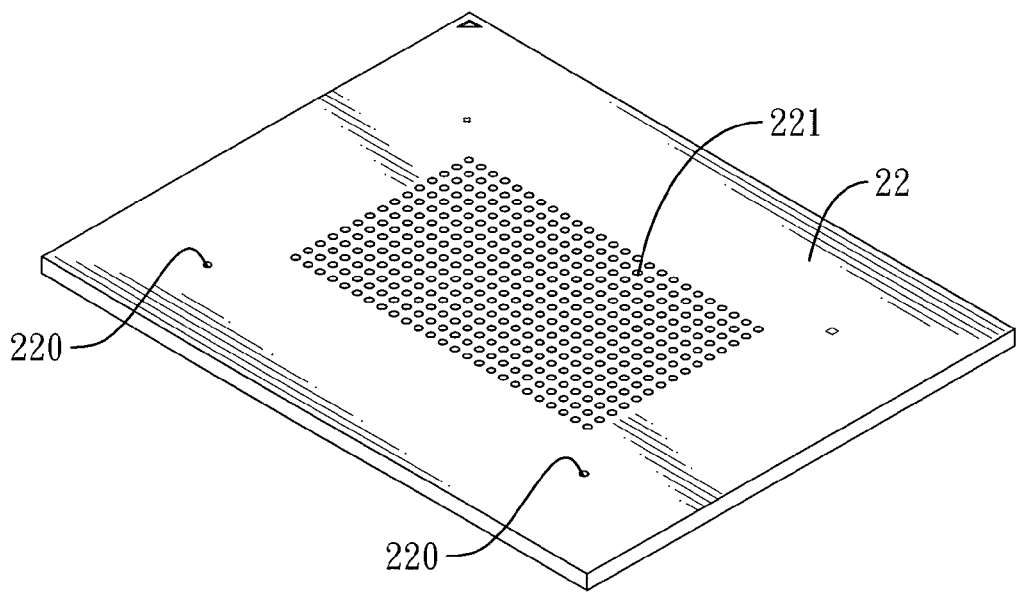
FIG. 7 is a perspective view of a space transformer of the probe card in FIG. 1.
Figure 8:
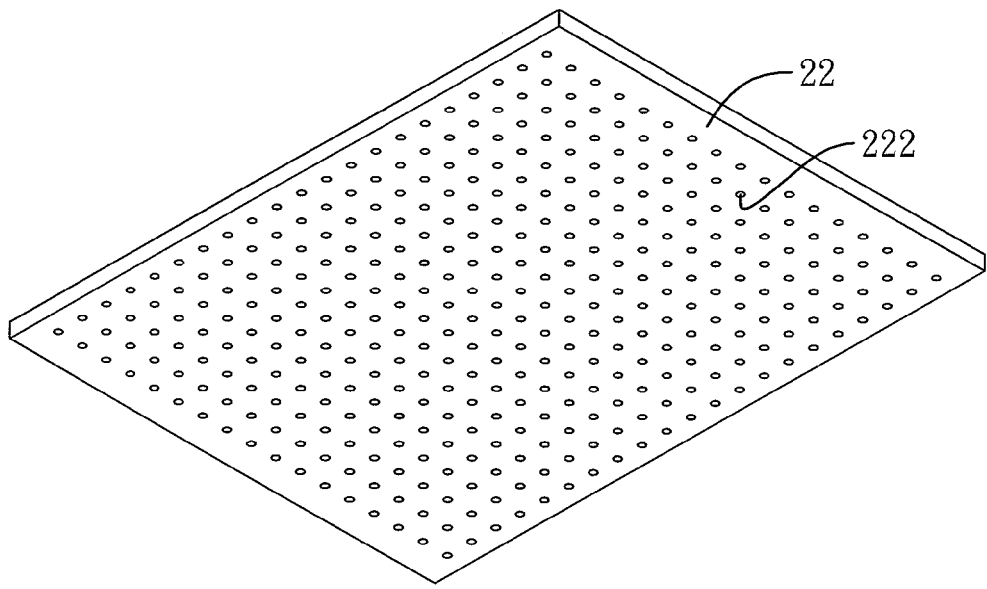
FIG. 8 is another perspective view of the space transformer in FIG. 7.

The space transformer 22 is mounted on a bottom of the frame assembly 20 and within the second hollow-out area 202 of the frame assembly 20. In the present embodiment, the space transformer 22 is mounted in the transformer recess 205. With reference to FIGS. 7 and 8, the space transformer 22 has multiple reference points 220 and multiple intermediate circuits. The reference points 220 are formed on a top of the space transformer 22 and respectively align with the through holes 212 of the ceramic board 210. The intermediate circuits align with the probes 211 and are formed within an area surrounded by the reference points 220. Each intermediate circuit has multiple upper connection terminals 221 and multiple lower connection terminals 222. The upper connection terminals 221 are formed on the top of the space transformer 22. The lower connection terminals 222 are formed on a bottom of the space transformer 22 and respectively and electrically connect with the upper connection terminals 221. When the probe assembly 21 and the space transformer 22 are mounted on the frame assembly 20, each reference point 220 can align with a corresponding through hole 212 of the probe assembly 21 and each upper connection terminal 221 electrically contacts a bottom end of a corresponding probe 211. Hence, when the probe assembly 21 and the space transformer 22 are mounted on the frame assembly 20, the space transformer 22 constitutes correct electrical connection with the probe assembly 21 as long as the through holes 212 respectively align with the reference points 210.

The fixing plate 23 is annular and has a probe opening 230, a probe assembly recess 231 and multiple notches 232. The probe opening 230 is centrally formed through the fixing plate 23 and aligns with the probes 211 of the probe assembly 21. The probe assembly recess 231 is formed in a bottom of the fixing plate 23 for a top of the probe assembly 21 to be mounted in the probe assembly recess 231. The notches 232 are formed through an inner circumferential edge of the fixing plate 23, communicate with the probe opening 230 and respectively align with the through holes 212 of the probe assembly 21. Thus, the through holes 212 and the probes 211 are respectively exposed from the probe opening 230 and the notches 232.

The probe module 2 is mounted between the fixing plate 23 and the fixing plate recess 111 of the holding member 11 and is securely mounted on the holding member 11, so that the frame assembly 20, the probe assembly 21 and the space transformer 22 are positioned in the first hollow-out area 110 of the holding member 11 and the lower connection terminals 222 on the bottom of the space transformer 22 electrically and respectively contact the contact pads 120 of the transfer circuits.

With reference to FIGS. 2 to 5, the wafer probe card that is mounted on a load board is shown. When the wafer probe card is applied to a wafer tester, the wafer probe card is inverted, and the holding member 11 of the adapter module 1 is securely mounted on the load board 10 of the wafer tester. The contact pads on the interposer 12 electrically and respectively contact the contact points 100 of the load board 10 through the intermediate circuits of the space transformer 22, so that each probe 211 electrically contacts a corresponding contact point 100 on the load board 10. The contact points 100 of the load board 10 further electrically connect to a microprocessor of the wafer tester.

Figure 9:
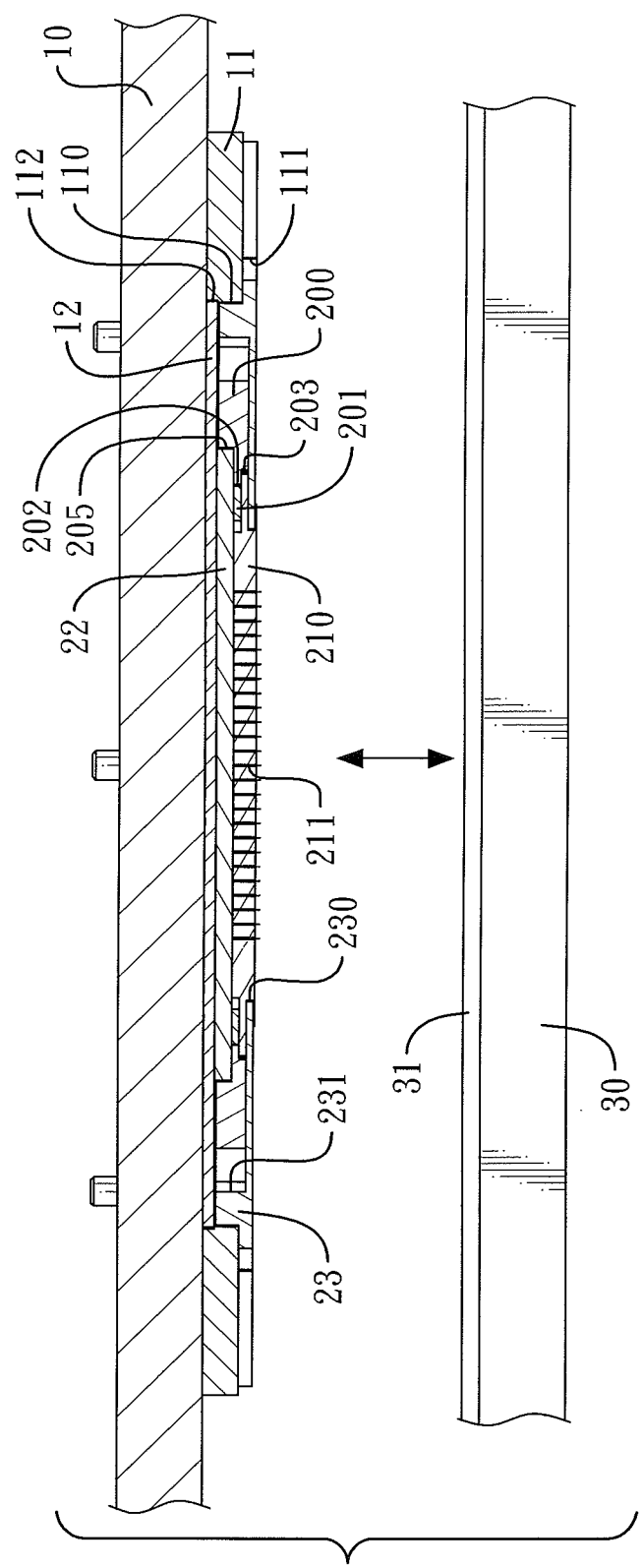
FIG. 9 is an operational side view in partial section of the wafer probe card in FIG. 5 applied to a wafer to be tested.
Figure 10:
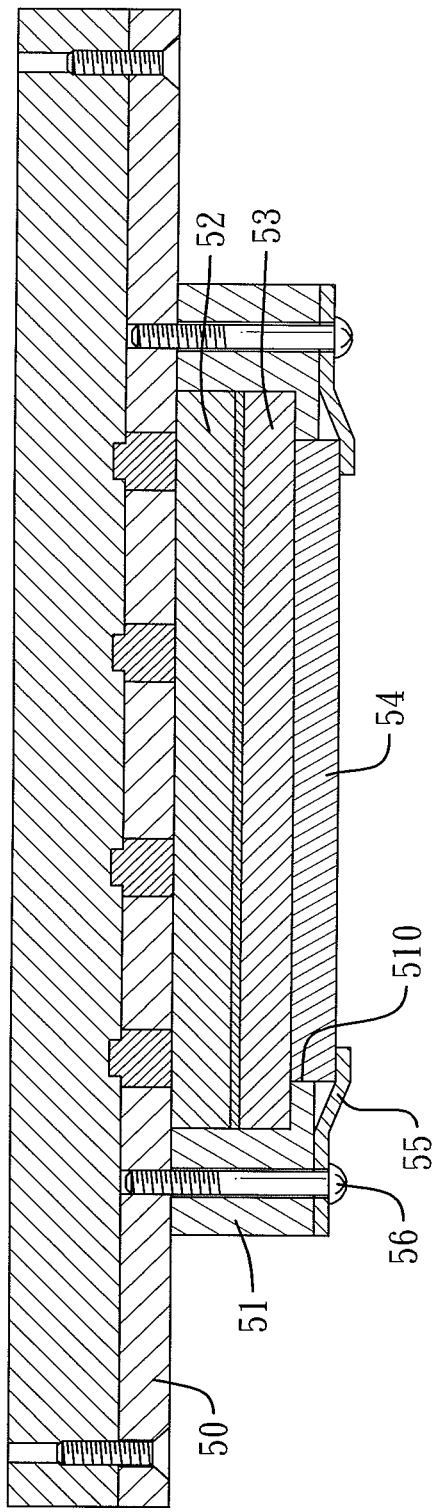
FIG. 10 is a side view in partial section of a conventional wafer probe card.

With reference to FIG. 9, when a wafer 31 is tested, the wafer 31 is placed on a wafer chuck 30. The probes 211 are operated to electrically and respectively contact the contact points on a die. The microprocessor further transmits test signals to the wafer 31 and receives responding signals from the wafer 31 through the probes 211 for the microprocessor to analyze and determine if the die functions correctly in completion of the wafer test.

The wafer probe card of the present invention is combined by the adapter module 1 and a probe module 2, which are detachable. If any one of the interposer 12 and the space transformer 22 is faulty and needs to be replaced, the adapter module 1 or the probe module 2 can be detached individually instead of disassembling the entire elements of the wafer probe card. Additionally, the adapter module 1 or the probe module 2 can be completely replaced on a modular basis. Accordingly, given the speed and convenience in reassembling the wafer probe card, the wafer probe card is more efficient in operation.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A wafer probe card comprising:
   an adapter module having:
      a holding member having:
         a first hollow-out area centrally formed through the holding member;
         a fixing plate recess annularly formed in a top of the holding member and around the first hollow-out area; and
         an interposer recess formed in a bottom of the holding member and around the first hollow-out area; and
      an interposer detachably mounted in the interposer recess of the bottom of the holding member and aligning with the first hollow-out area of the holding member, wherein the interposer has multiple contact pads respectively formed on two opposite sides of the interposer, wherein the contact pads on one side of the interposer are electrically and respectively connected with the contact pads on the other side of the interposer; and
   a probe module having:
      a frame assembly having a second hollow-out area centrally formed through the frame assembly;
      a space transformer mounted in the second hollow-out area and having multiple connection terminals respectively formed on a top and a bottom of the space transformer, wherein the multiple connection terminals on the top of the space transformer are respectively and electrically connected with the multiple connection terminals on the bottom of the space transformer;
      a probe assembly mounted within the second hollow-out area and having multiple probes respectively and electrically contacting the multiple connection terminals of the space transformer; and
      a fixing plate mounted in the fixing plate recess, with the fixing plate having a probe opening centrally formed through the fixing plate and aligning with the multiple probes of the probe assembly, wherein the probe module is mounted on the top of the holding member of the adapter module by mounting the fixing plate on the holding member, wherein the frame assembly, the probe assembly and the space transformer are positioned in the first hollow-out area of the holding member and the multiple connection terminals on the bottom of the space transformer electrically and respectively contact the multiple contact pads of the interposer.

2. The wafer probe card as claimed in claim 1, wherein:
   the probe assembly has multiple through holes formed through the probe assembly,
   the multiple probes are formed within an area of the probe assembly surrounded by the multiple through holes; and
   the space transformer has multiple reference points formed thereon and respectively aligning with the multiple through holes of the probe assembly.

3. The wafer probe card as claimed in claim 2, wherein:
   the probe assembly has a ceramic board;
   the multiple probes are formed through the ceramic board; and
   the multiple through holes are vertically formed through a circumferential edge of the ceramic board.

4. The wafer probe card as claimed in claim 3, wherein the frame assembly of the probe module further has:
   a lower frame having:
      the second hollow-out area being rectangular and centrally formed through the lower frame;
      two positioning recesses, with each positioning recess respectively formed in top of one of two long edges of the lower frame;
      four positioning channels, with each positioning channel formed in a top of one of four corners of the lower frame; and
      a transformer recess formed in a bottom and around a perimeter of the second hollow-out area of the lower frame; and
   an upper frame being rectangular, mounted on a top of the lower frame and within the second hollow-out area, and having:
      a third hollow-out area centrally formed through the upper frame; and
      four protrusions respectively formed on and protruding from four corners of the upper frame, and respectively mounted in the four positioning channels.

5. The wafer probe card as claimed in claim 2, wherein the frame assembly of the probe module further has:
   a lower frame having:
      the second hollow-out area being rectangular and centrally formed through the lower frame;
      two positioning recesses, with each positioning recess respectively formed in a top of one of two long edges of the lower frame;
      four positioning channels, with each positioning channel formed in a top of one of four corners of the lower frame; and
      a transformer recess formed in a bottom and around a perimeter of the second hollow-out area of the lower frame; and an upper frame being rectangular, mounted on a top of the lower frame and within the second hollow-out area, and having:
a third hollow-out area centrally formed through the upper frame; and
four protrusions respectively formed on and protruding from four corners of the upper frame, and respectively mounted in the four positioning channels.

6. The wafer probe card as claimed in claim 1, wherein the frame assembly of the probe module further has:
a lower frame having:
the second hollow-out area being rectangular and centrally formed through the lower frame;
two positioning recesses, with each positioning recess respectively formed in a top of one of two long edges of the lower frame;
four positioning channels, with each positioning channel formed in a top of one of four corners of the lower frame; and
a transformer recess formed in a bottom and around a perimeter of the second hollow-out area of the lower frame; and
an upper frame being rectangular, mounted on a top of the lower frame and within the second hollow-out area, and having:
a third hollow-out area centrally formed through the upper frame; and
four protrusions respectively formed on and protruding from four corners of the upper frame, and respectively mounted in the four positioning channels.

* * * * *